United States Patent [19]

Covert et al.

[11] Patent Number: 5,895,312
[45] Date of Patent: Apr. 20, 1999

[54] APPARATUS FOR REMOVING SURFACE IRREGULARITIES FROM A FLAT WORKPIECE

[75] Inventors: Dennis Albert Covert, Poughkeepsie, N.Y.; Leonard James Gardecki, Essex, Vt.; David Clyde Linnell, Poughkeepsie, N.Y.; Brian J. Stark, Wappingers Falls, N.Y.; David M. Waligunda, Hopewell Junction, N.Y.; Robert Peter Westerfield, Jr., Montgomery, N.Y.; William Wayne Witmer, Milford, Pa.

[73] Assignee: International Business Machines Corporation, Armonk, N.Y.

[21] Appl. No.: 08/739,769

[22] Filed: Oct. 30, 1996

[51] Int. Cl.⁶ .......................... B24B 49/00; B24B 51/00
[52] U.S. Cl. ................................ 451/8; 451/167
[58] Field of Search ...................... 451/162, 166, 451/167, 296, 299, 300, 302, 303, 304, 65, 57, 9, 10, 11, 12, 21, 13, 23, 261; 364/474.01, 474.06, 474.37

[56] References Cited

U.S. PATENT DOCUMENTS

| | | | |
|---|---|---|---|
| 3,650,073 | 3/1972 | Weisman | 451/303 |
| 3,701,219 | 10/1972 | Sternal | 451/300 |
| 3,754,354 | 8/1973 | Franlinna | 451/167 |
| 3,908,316 | 9/1975 | Rettew | 451/300 |
| 4,125,637 | 11/1978 | Tanner | 428/198 |
| 4,141,135 | 2/1979 | Henry et al. | 29/580 |
| 4,288,233 | 9/1981 | Wiand | 51/295 |
| 4,430,782 | 2/1984 | Bornhorst et al. | 29/90 R |
| 4,514,937 | 5/1985 | Gehring et al. | 51/281 SF |
| 4,583,271 | 4/1986 | Diener | 29/90 B |
| 4,594,815 | 6/1986 | Mickelson et al. | 451/300 |
| 4,656,790 | 4/1987 | Mukai et al. | 51/141 |
| 4,962,618 | 10/1990 | Wylde | 51/395 |
| 4,976,020 | 12/1990 | Nagashima et al. | 29/90.01 |
| 5,099,558 | 3/1992 | Wilson | 29/90.01 |
| 5,191,739 | 3/1993 | Kondo et al. | 51/287 |
| 5,203,117 | 4/1993 | Jen | 451/296 |
| 5,443,414 | 8/1995 | Haney | 451/166 |

*Primary Examiner*—David A. Scherbel
*Assistant Examiner*—Derris Holt Banks
*Attorney, Agent, or Firm*—Steven Capella

[57] ABSTRACT

An apparatus for removing surface irregularities from a flat workpiece includes one or more abrading assemblies through which the workpiece passes sequentially. Each abrading assembly has a lower contact assembly and an upper contact assembly. The upper contact assembly is precisely spaced above the lower contact assembly in opposing parallel relation to the lower assembly. The lower and upper contact assemblies reciprocate in opposing directions to provide abrading action to the workpiece.

12 Claims, 7 Drawing Sheets

APPARATUS FOR REMOVING SURFACE IRREGULARITIES FROM A FLAT WORKPIECE

FIELD OF THE INVENTION

This invention relates in general to machining methods and apparatus and more specifically to removing surface irregularities or defects from a flat workpiece.

BACKGROUND OF THE INVENTION

Masks are used at various stages in semiconductor processing and packaging to form patterns on various types of substrates. For instance, masks of various materials (e.g. metal, quartz etc.), sizes and types may be used in conjunction with photosensitive materials to expose and form semiconductor devices in a semiconductor substrate. Masks may be used to form interconnections between semiconductor devices. Additionally, masks are commonly used to form interconnection patterns used to connect integrated circuits to packaging substrates. For example, masks are commonly used to form controlled collapse chip contacts ("C4") on semiconductor wafers for making connection between an integrated circuit chip and a ceramic substrate.

Defects on the surface of a mask can arise during mask fabrication or subsequent handling. Such defects generally take the form of non-planar areas (e.g. "high spots") or other irregularities on the generally flat surface of the mask. The defects can cause a variety of problems. For example, if the "high spot" flakes off the mask and lodges in the surface of a semiconductor wafer, it may cause an immediate or future accidental electrical short, particularly if the mask is metal. Or, a defect may scratch the wafer, resulting in physical damage that can also be manifested by functional or reliability failures. In addition, non-planar masks (e.g. masks which do not have a uniform thickness across their surface area) can cause inaccuracies in patterning.

Because of the difficulties created by defects on the mask surface, great care is taken to avoid or minimize the occurrence of the defects. Masks are carried in protective containers designed to avoid damage to the masks and are carefully inspected after fabrication and after each use to identify defects so that the defective masks are not used to process semiconductor wafers. While this practice helps to avoid the defective masks from contaminating or otherwise damaging wafers, it results in unacceptable waste of the defective masks. What is needed is a method to repair the defective masks, so that they may be re-used without causing damage or contamination to the underlying substrate to be processed.

SUMMARY OF THE INVENTION

It is an object of the present invention to remove surface irregularities or defects from a generally flat workpiece.

It is a further object of the present invention to remove surface irregularities or defects from two opposing sides of a flat workpiece.

It is further object still of the present invention to remove surface irregularities or defects from a generally flat workpiece while maintaining a desired uniform thickness across the workpiece.

It is a further object still to provide an apparatus capable of removing surface irregularities or defects from generally flat workpieces of varying sizes.

The present invention is directed to an apparatus for abrading a flat workpiece. The apparatus includes a means for transporting the workpiece across a work path, at least one abrading assembly, and a reciprocating means. The abrading assembly includes an upper and lower contact assembly, each having a contacting platen, each contacting platen having a contact surface for abrading the workpiece. The lower contact assembly is positioned below the upper contact assembly in generally opposing parallel relation to the upper contact assembly, such that there is a space between the contact surfaces of the upper and lower contact assemblies. The reciprocating means is coupled to the upper and lower contact assemblies and reciprocated each of the upper contact assembly and lower contact assembly in opposing directions along a principal axis perpendicular to the work path.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DETAILED DESCRIPTION OF THE PREFERRED EMBODIMENT

Figure 1:
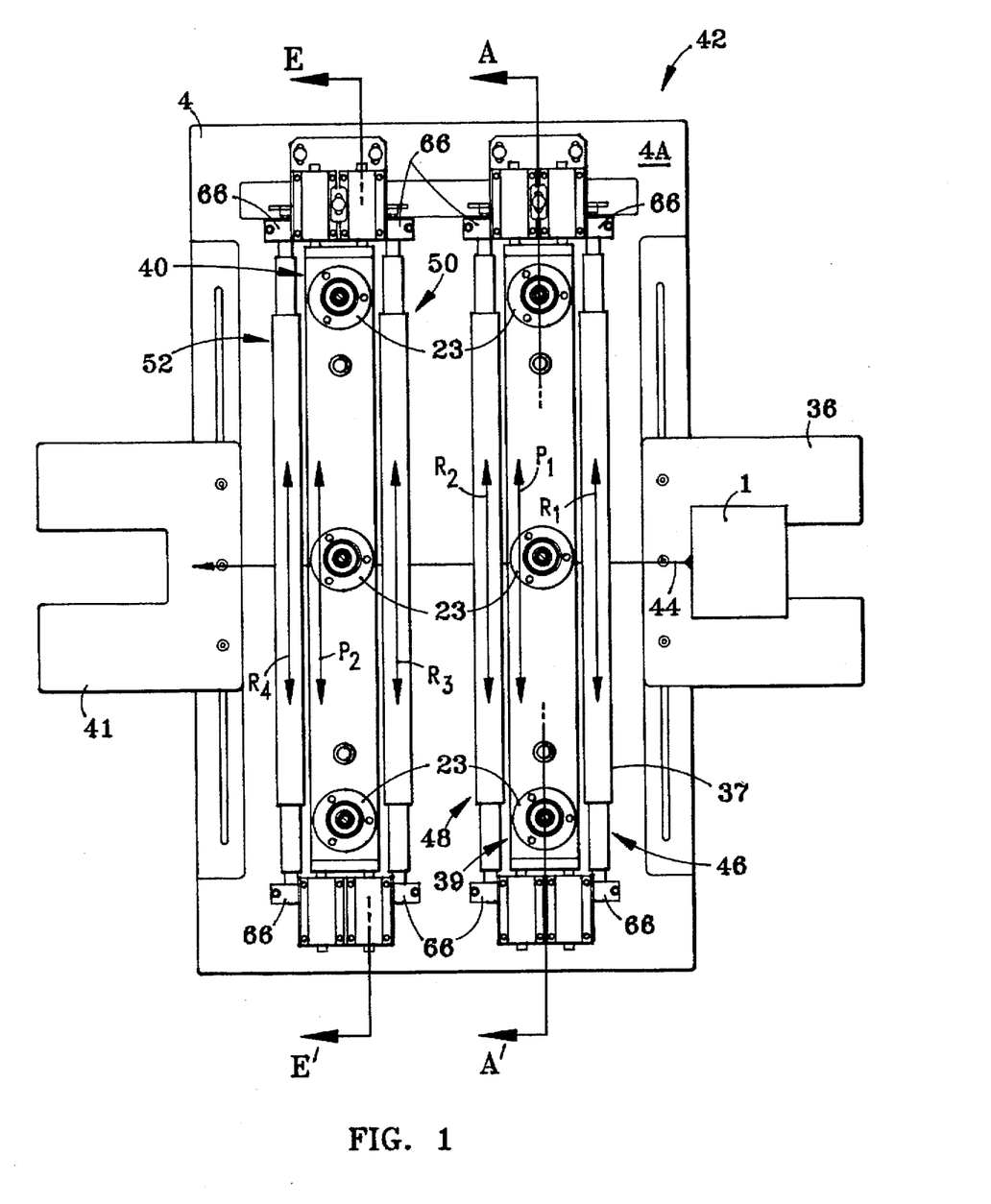
FIG. 1 is a top plan view of a preferred embodiment of the apparatus of the present invention showing the major components of the apparatus and the work path travelled by a workpiece on which the apparatus operates.

FIG. 1 depicts a top view of a preferred embodiment of the present invention. With reference to FIG. 1 there is shown an apparatus 42 for removing surface irregularities or defects from, or otherwise abrading, a generally flat workpiece. The apparatus 42 includes at least one abrading assembly 39, and preferably a pair of abrading assemblies 39 and 40, for abrading a workpiece. Each abrading assembly has a principal axis $P_n$ (for example, abrading assembly 39 has principal axis $P_1$ and abrading assembly 40 has principal axis $P_2$) which is perpendicular to a workpath 44 travelled by the workpiece as it is operated upon by the apparatus 42. Principal axis $P_1$ is preferably parallel to principal axis $P_2$. The number of abrading assemblies used may be altered in accordance with the nature of the surface irregularities or defects and the desired surface finish of the work piece 1. The workpath 44 begins at a loading station 36 where the workpiece 1 is staged for loading into the apparatus 42. The workpiece 1 may be loaded from the loading station 36 into the apparatus 42 manually or by well known automatic means such as an air track, conveyer, propulsion, belt drive or other suitable mechanical means. As the work piece 1 is loaded from the loading station 36, along a top surface 4A of a transport plate 4, drive assemblies 46 and 48 drive the workpiece through abrading assembly 39. Similarly, drive assemblies 50 and 52 drive the workpiece through abrading assembly 40, and onto unloading station 41. As the workpiece 1 is driven through abrading assemblies 39 and 40, abrading assemblies 39 and 40 provide reciprocating motion along their principal axes $P_1$ and $P_2$, as will be described in further detail hereinbelow. Unloading may be performed manually or automatically as mentioned above with respect to loading.

Figure 2:
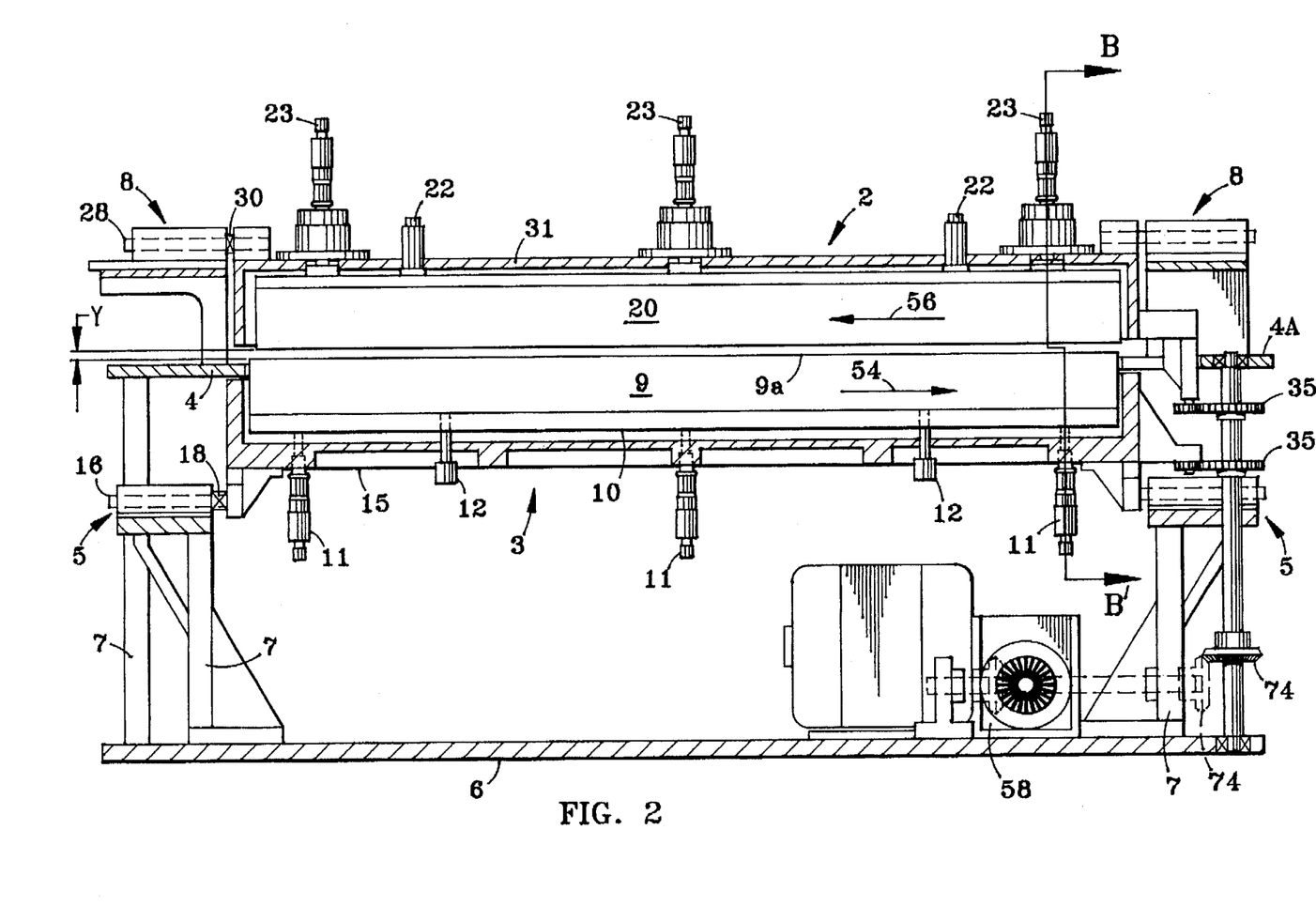
FIG. 2 is a cross-sectional view through cross-section line A–A' in FIG. 1 depicting the elevation of lower and upper contact assemblies of an abrading assembly.

FIG. 2 is a cross-sectional view through cross-section line A-A' in FIG. 1 depicting details of abrading assembly 39. In light of the disclosure contained herein it will be understood by a person of ordinary skill in the art that abrading assembly 39 and abrading assembly 40 can be substantially identical in structure and function. Abrading assembly 39 includes lower contact assembly 3 and upper contact assembly 2 supported in a generally parallel opposed relation. The lower contact assembly 3 and transport plate 4 are supported by base 6 and supporting members 7. The upper contact assembly 2 is, in turn, supported by the transport plate 4 and spaced above the lower contact assembly 3. The spacing Y between the upper contact assembly 2 and lower contact assembly 3 can be adjusted by means of a plurality of upper contact assembly micrometers 23 and/or lower contact assembly micrometers 11. Each of the lower contact assembly 3 and upper contact assembly 2 is slidably mounted to the supporting members 7 by means of respective bearing assemblies 5 and 8, so as to allow for freedom of motion in a direction parallel to the principal axis $P_1$ (FIG. 1). Reciprocating motion as indicated by arrows 54 and 56 is provided by cams 35, as coupled to motor 58, in conjunction with compression springs 18 and 30, as will be described in further detail hereinbelow. The top surface 4A of the transport plate 4 can be level with or slightly below a contacting surface 9A of the lower contact assembly 3, so as to avoid causing the workpiece 1 (FIG. 1) to undergo undue stress or become damaged.

Figure 3A:
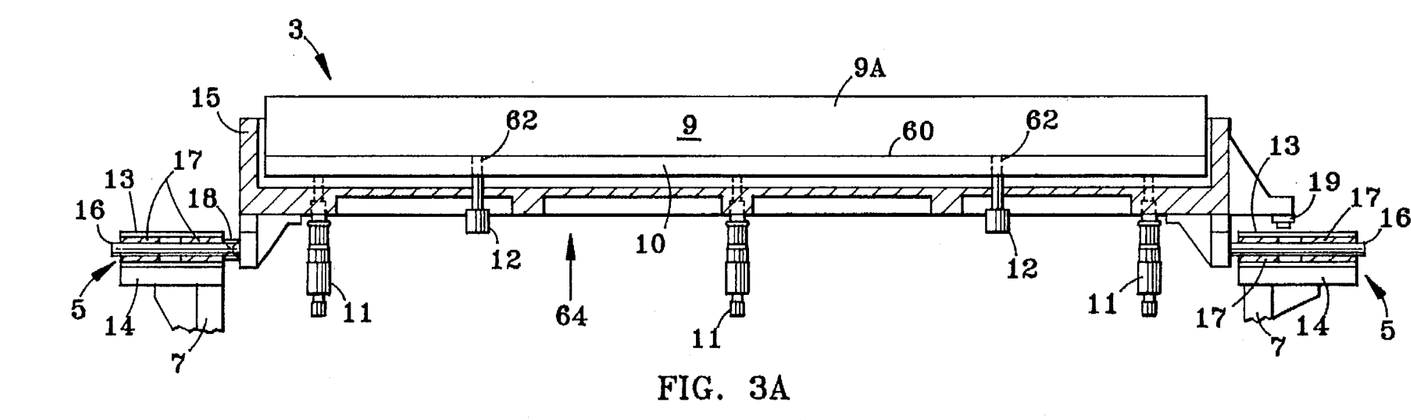
FIG. 3A is a cross-sectional view through cross-section line E–E' in FIG. 1 of the lower contact assembly of the abrading assembly in FIG. 2 and associated mounting means.
Figure 3B:
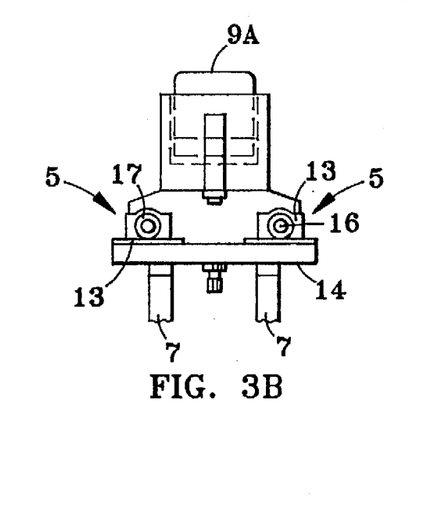
FIG. 3B is a right-side view of FIG. 3A depicting the lower contact assembly of the abrading assembly and associated mounting means.

With reference to FIGS. 3A and 3B, which show the lower contact assembly 3 in further detail, the lower contact assembly 3 includes a lower contacting platen 9 contained within a lower contact assembly housing 15. Contacting platen 9 has a contact surface 9A for abrading the workpiece. The contacting platen 9 should be dimensioned according to the dimensions of the workpiece 1 (FIG. 1). The contact surface 9A should have a flatness and surface finish commensurate with the desired flatness of the workpiece and such that it is capable of fully contacting a first surface of the workpiece. Where the workpiece is a relatively hard material, such as a metal, for example, molybdenum, the contacting platen 9 is preferably granite. For example, a Barre Gray Granite rubbing plate or stone, manufactured by Rock of Ages Corp., located in Graniteville, Vermont is suitable. Alternatively, the contact surface 9A can be provided by a variety of mediums capable of abrading the surface of the workpiece. For example, a polishing cloth or emery cloth stretched across or mounted on a suitable support may also be used. Similarly, an abrasive material (e.g. diamond) may be embedded in another material. Slurry compounds may also be used in combination with a variety of platen materials.

The lower contact housing 15 is preferably formed of metal, more preferably cast metal, for example cast aluminum, but other materials, which are strong enough to support the weight of the contacting platen 9 while the lower contact assembly 3 is in reciprocating motion may also be used. The contacting platen 9 may account for a substantial portion of the overall weight of the lower contact assembly 3, particularly if the lower contacting platen 9 is granite, or another dense material.

The lower contacting platen 9 is integrally attached to a lower platen backing 10 along a surface 60 opposite the abrading surface 9A by any suitable fastening means, such as screws or other mechanical fasteners, or an adhesive (e.g. epoxy). The backing 10 should be strong, preferably relatively light in weight, and relatively easy to be formed (e.g. by machining or otherwise) with a high degree of flatness to a high degree of flatness. Aluminum is preferred, but other materials providing these characteristics would be suitable. The backing 10 is provided with locating holes 62. Locking screws 12 locate the lower contacting platen 9 within the lower contact housing 15 by mating to locating holes 62 in the backing 10, and further provide support to and maintain the position of the lower contacting platen 9 by firmly attaching the lower contact assembly housing 15 to the lower contacting platen 9. Once the locking screws 12 initially mate with the locating holes 62, lower contact assembly micrometers 11 mounted on the underside 64 of lower contact assembly housing 15 can be used to adjust the level of the lower contacting platen 9 relative to the top surface 4A of the transport plate 4 (see FIG. 2). The position of the lower contacting platen 9 is maintained by engaging the locking screws 12 such that the lower backing platen 10 is urged against the lower contact assembly micrometers 11. Micrometers suitable for use as lower contact assembly micrometers 11 are commercially available from Brown and Sharp, located in North Kingstown, R.I.

FIGS. 3A and 3B further show details of how the lower contact assembly 3 is slidably mounted to supports 7. On either end of the lower contact assembly housing 15, a pair of shafts 16, fixed to and extending from the lower contact assembly housing 15 in a direction parallel to the principal axis $P_1$ (FIG. 1), couple to lower bearing assemblies 5 which are mounted on supports 7. Each lower bearing assembly 5 includes a pair of lower bearing housings 13 positioned on either side of the lower contact assembly 3 and suitably mounted to supports 14, which are in turn mounted to supports 7. Positioned within each lower bearing housing 13 is one or more bearings 17 which allow shafts 16 to slide in a direction parallel to the principal axis $P_1$. For example, bearings 17 may be ring bearings. A compression spring 18 is positioned around each of the shafts 16 on one end of the lower contact assembly 3 (left end as drawn, hereinafter referred to as the spring end), and is located in a space between the lower bearing housing 13 and the lower contact housing 15. A cam follower roller bearing 19 is fixed to the end of the lower contact housing 3 that is opposite the spring end (e.g. the cam end).

Figure 4A:
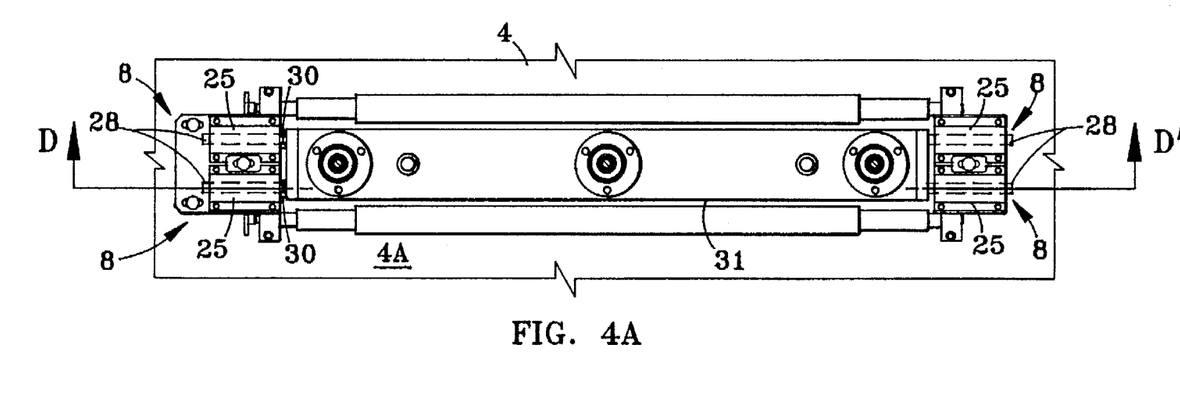
FIG. 4A is a top plan view of the upper contact assembly of the abrading assembly in FIG. 2 and associated mounting means.
Figure 4B:
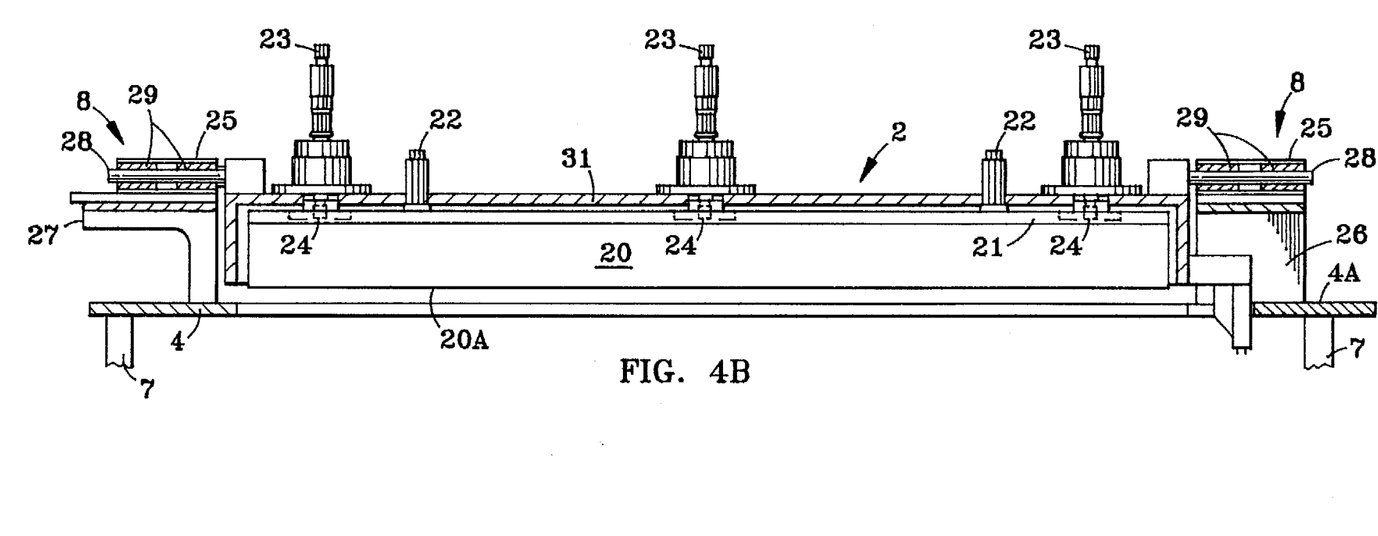
FIG. 4B is a cross-section of FIG. 4A through cross-section line D–D' depicting the upper contact assembly of the abrading assembly and associated mounting means.

With reference to FIGS. 4A and 4B, which show portions of the upper contact assembly 2 in further detail, the upper contact assembly 2 is structurally similar to the lower contact assembly 3 described hereinabove. Upper contacting platen 20, and the upper contact assembly housing 31 within which the upper contacting platen 20 is contained, can be similar to that described above with reference to the lower contacting platen 9 and lower contact assembly housing 15, respectively. Similarly, upper contacting platen 20 has an integral backing 21 which can be attached to platen 20 as described above with respect to the lower contacting platen backing 10. The upper contacting platen 20 is located within the upper contact housing 31 by means of locating pins 22 which mate to holes in the upper contacting platen backing 21. The level and height of the upper contacting platen 20 relative to the top surface 4A of transport plate 4 can be controlled by adjusting a plurality of upper contact assembly micrometers 23. Such adjustment allows the upper contacting platen 20 to be spaced a desired distance Y (FIG. 2) from and parallel to lower contacting platen 9. The upper contact assembly micrometers 23 are fixed to the housing so as to provide support to and maintain the position of the upper contacting platen by suspension. More particularly, a shaft of each of the upper contact assembly micrometers 23 is fastened (e.g by press fit) to an inner race (not specifically shown) of individual radial bearings 24, the outer race (not specifically shown) of which is fastened (e.g. by press fit) to the upper platen backing 21. This configuration allows for the rotational adjustment of the upper contact assembly micrometers 23 to be translated into linear travel required to set the desired dimensional gap Y between the upper contact platen 20 and the lower contact platen 9 (FIGS. 3A, 3B).

FIGS. 4A and 4B further show details of how the upper contact assembly 2 is slidably mounted to supports 7, which mounting is similar to that of the lower contact assembly 3. On either end of the upper contact assembly housing 31, a pair of shafts 28, fixed to and extending from the upper contact assembly housing 31 in a direction parallel to the principal axis $P_1$ (FIG. 1), couple to upper bearing assemblies 8 which are mounted on supports 26 and 27, which are, in turn, mounted on transport plate 4. Each upper bearing assembly 8 includes a pair of bearing housings 25, one positioned on either side of the upper contact assembly 2 supports 26 and 27. Positioned within each upper bearing housing 25 is one or more bearings 29 which allow shafts 28 to slide in a direction parallel to the principal axis $P_1$, in a manner similar to the discussion above with reference to bearings 17 and lower contact assembly 2. A compression spring 30 is positioned around each of the shafts on one end of the upper contact assembly 2 (e.g. the spring end), and is located in a space between the upper bearing housing 25 and the lower contact housing 31. A cam follower roller bearing 32 is fixed to the opposite end of the upper contact housing 2 (e.g. the cam end).

Figure 7:
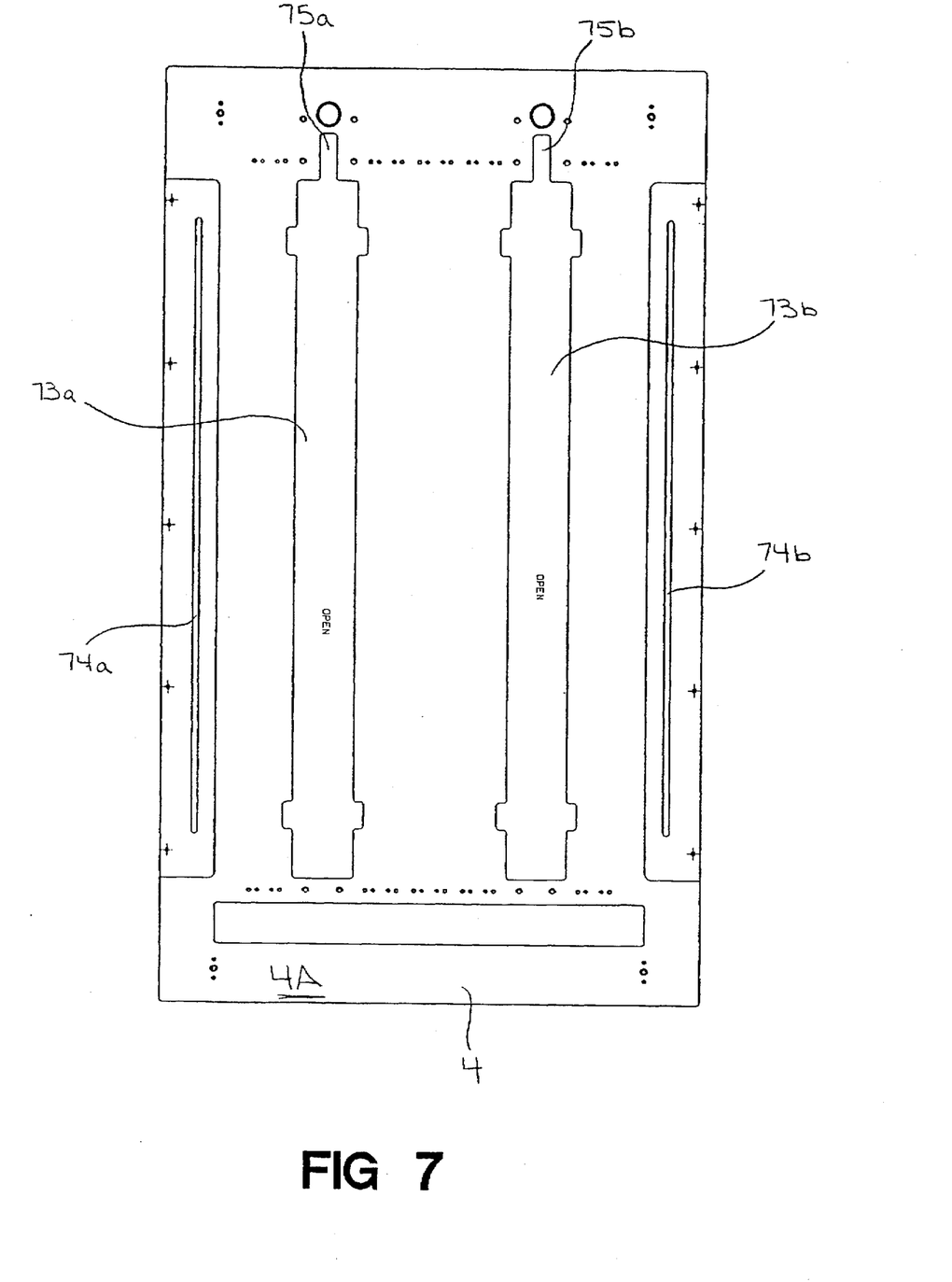
FIG. 7 is a top view of the transport plate of the apparatus shown in FIG. 1.

FIG. 7 is a top plan view of the transport plate 4. Transport plate 4 has clearance openings 73a and 73b for receiving the respective abrading assemblies 39 and 40, thus providing freedom of motion of the abrading assemblies along the principal axes $P_1$ and $P_2$. Openings 75a and 75b similarly allow cam followers 32 to connect to cam hardware below (discussed in further detail hereinbelow). Transport plate also has slots 74a and 74b to which loading and unloading stations can be joined. The slots 74a and 74b provide a means for adjusting the size and location of the loading station in accordance with the workpiece to be operated upon. Thus workpieces of varying sizes can be accommodated.

Figure 6:
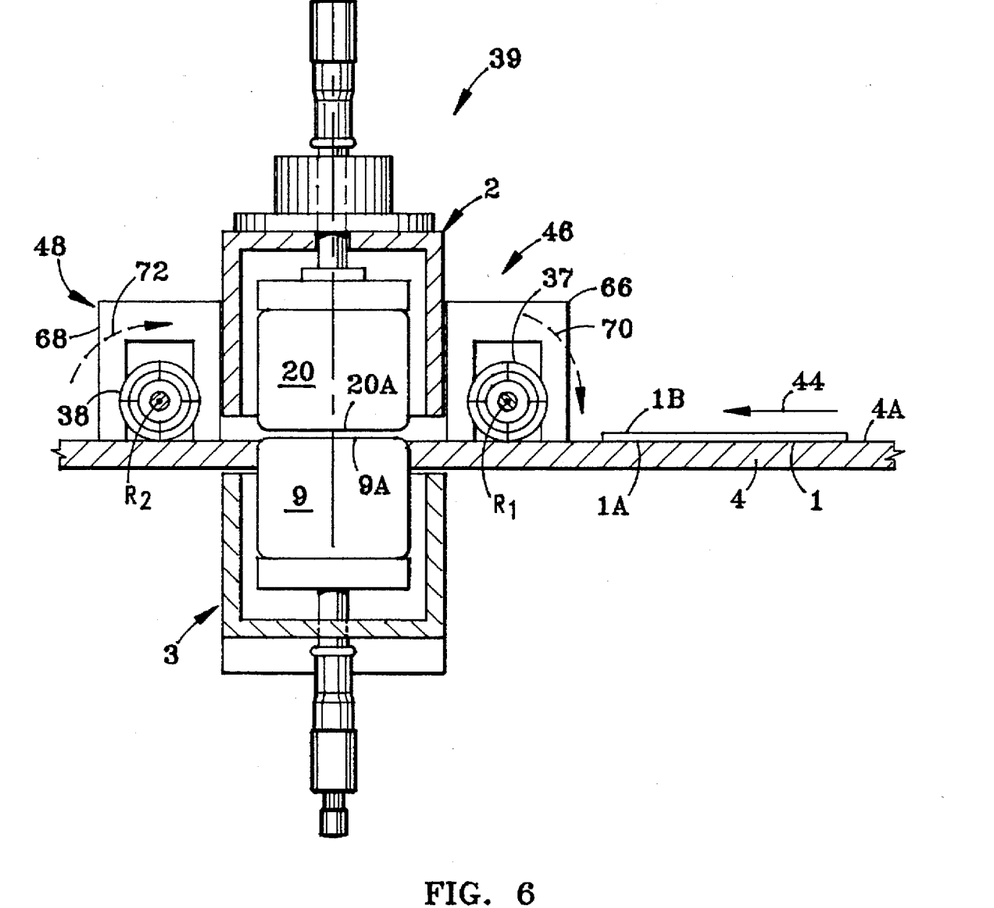
FIG. 6 is a cross sectional view through cross-section line B–B' of FIG. 2 of an abrading assembly and associated drive assemblies.

FIG. 6 is a cross-sectional view through cross-section line B–B' of FIG. 2 of abrading assembly 39 and flanking drive assemblies 46 and 48. Referring now to FIGS. 1 and 6, the top surface 4A of the transport plate 4 is preferably parallel to and slightly lower than the contacting surface 9A of the lower contacting platen 9. A first drive assembly 46 includes mounting means 66 (e.g. a bracket) and roller 37. The roller 37 is preferably made up of or coated with a compliant material, such as silicone rubber or other elastomeric materials, so as not to apply excessive force to the workpiece 1. Roller 37 is rotatably mounted to the transport plate via mounting means 66 such that a central rotation axis $R_1$ of the roller 37 runs parallel to the principal axis $P_1$ (FIG. 1) and is positioned above the top surface 4A of the transport plate 4. The distance between the central rotation axis $R_1$ and a top surface 1A of the workpiece 1 can vary depending upon the compliancy of the roller and the fragility of the workpiece 1. The mounting means 66 can be a bracket fixed to transport plate 4 and having an opening in which there is installed roller bearings (not shown) for receiving and supporting the roller. Preferably a pair of mounting means 66 are provided, one on either end of the roller 37 (see FIG. 1). The roller 37 can be coupled to a motor (not shown) to provide positive drive rotation about the central rotation axis $R_1$ in the direction indicated by arrow 70. Multiple rollers may be coupled to the same motor by one or more belts or chains. As the workpiece 1 is caused to travel along workpath 44 and engage roller 37 the workpiece 1 is driven, or pushed into, the gap between the lower 9 and the upper 20 contact platens, which gap has been previously been adjusted to produce the desired abrading surface finish. The contacting surfaces 9A and 20A of respective lower and upper contacting platens 9, 20 simultaneously act upon the lower 1A and the upper 1B surfaces of the work piece 1. As the work piece 1 exits the lower 9 and the upper 20 contacting platens, the workpiece 1 is taken up and driven out by a second drive assembly 48. The second drive assembly 48 is positioned adjacent the upper contact assembly 2 on the side opposite the first drive assembly 46, and is structurally similar to the first drive assembly. The first 46 and second drive 48 assembly rotate in the same direction and are arranged cooperatively such that as the work piece 1 leaves the first roller 37, the remaining portion of the work piece 1 is pulled through the lower 9 and the upper 20 contact platens by the second roller 38 and delivered to the second abrading assembly 40, also having its own pair of flanking drive assemblies 50 and 52; drive assembly 50 receives the workpiece 1 from drive assembly 48 and drives the workpiece 1 into the second abrading assembly 40, while drive assembly 52 receives the workpiece from the second abrading assembly and drives it out to unloading station 41.

Figure 5A:
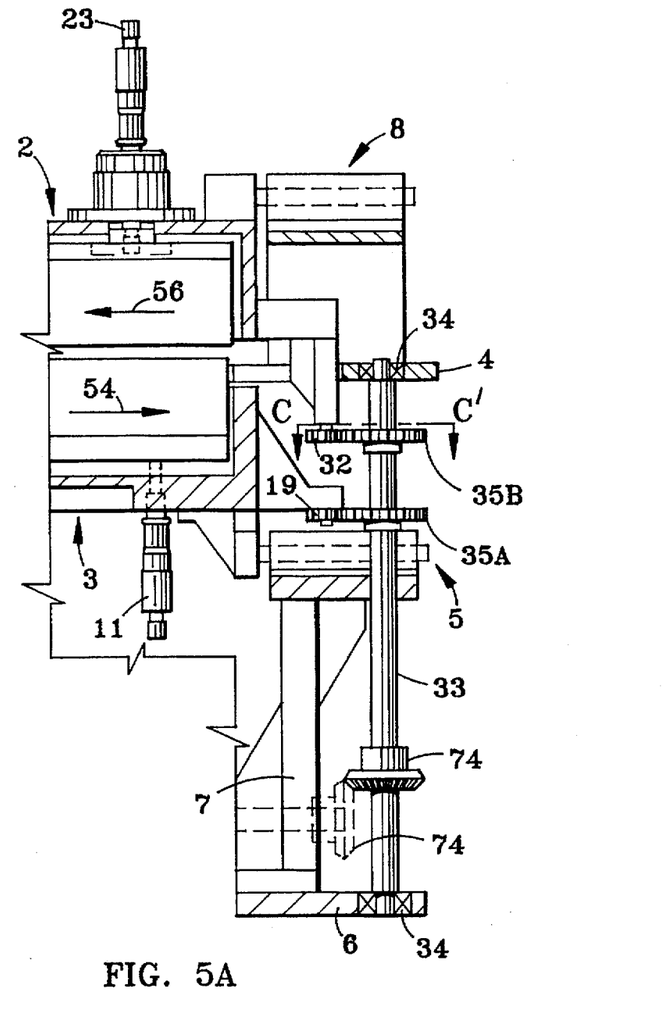
FIG. 5A is an enlarged portion of the cross-sectional view shown in FIG. 2 illustrating details of how reciprocating motion of the abrading assembly is provided.
Figure 5B:
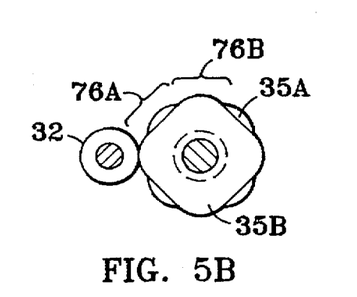
FIG. 5B is a partial cross-sectional view of FIG. 5A through cross-section line C–C' illustrating the relationship between the cam shaft, cams and cam followers.

The manner in which the abrading assemblies reciprocate will now be described in detail with reference to FIGS. 5A and 5B. FIG. 5A is an enlarged portion of the cross-sectional view shown in FIG. 2 illustrating details of how reciprocating motion is provided. FIG. 5B is a partial cross-section view through partial cross-section line C–C' illustrating the same with further clarity. A vertical cam shaft 33 is supported between the baseplate 6 and the transport plate 4 by means of radial roller ball bearings 34. The cam shaft 33 can be driven by any means which will provide rotation of the cam shaft 33, such as a motor 58 (FIG. 1) coupled to cam shaft via gears 74, preferably with a means by which the speed of the cam shaft 33 can be varied to adjust the reciprocating motion of the lower 3 and upper 2 contact assemblies. Mounted along the cam shaft 33 are removable complementary lower 35A and upper 35B cams, which are aligned with the respective cam follower roller bearings 19, 32 fixed to lower 3 and upper 2 contact assemblies respectively. The cams 35 are preferably identically shaped and should be mounted on cam shaft 33 in opposing phase (e.g. complementary) as shown more particularly in FIG. 5B (e.g. rotation through cam lobe 76A of cam 35A does not substantially coincide with rotation through cam lobe 76B of cam 35B and so forth). The rotation of cams 35A and 35B around the cam shaft 33 is translated to linear motion by respective cam follower roller bearings 19 and 32 and respective bearing assemblies 5 and 8. The compression springs 18, 30, referred to with regard to FIGS. 3A, 4A and 4B, initiate and maintain intimate contact between the cams 35A, 35B and respective cam follower roller bearings 19, 32 by urging the cam follower roller bearings 19, 32 against the cams 35. Thus, the upper 2 and lower 3 contact assemblies are caused to reciprocate parallel with the principal axis $P_1$ in opposite directions. More particularly, when upper contact assembly 2 is moving in the direction indicated by arrow 56, lower contact assembly is moving in the direction indicated by arrow 54, and vice versa. The opposing reciprocating motion of the contact assemblies 2 and 3 causes the desired abrading of the workpiece 1 (not shown). The cam lobe geometry and dimensions may be varied, as well as the phase of motion, and extended to individual drives, to establish varying reciprocating motion, phase, and speed in order to achieve desired abrading affects on the workpiece 1.

In view of the disclosure provided herein, a person of ordinary skill in the art would understand that other methods of reciprocating the upper 2 and lower 3 contact assemblies would also be suitable. For example, air cylinders could be coupled to the upper and lower contact assemblies and modulated so as to provide the out-of-phase motion described above.

Referring back to FIG. 2, to operate the machine, the gap Y between the upper 2 and lower 3 contact assemblies is first adjusted according to the desired thickness of the workpiece while the upper 2 and lower contact assemblies are stationary. The gap is preferably adjusted by first adjusting the lower contact assembly micrometers 11 of the lower contact assembly 3 such that the lower contact assembly 3 is parallel to and slightly above the top surface 4A of transport plate 4. Next, a reference shim having the desired thickness and flatness is placed between the upper 2 and lower 3 contact assemblies and the position of the upper contact assembly 2 is adjusted by adjusting the upper contact assembly micrometers 23. The settings of the upper 23 and lower 11 contact assembly micrometers can be recorded so that the desired settings can be reproduced once the reference shim is removed. After the gap has been set and locked down (e.g. by locking screws 12 and micrometers 23), the motor(s) can be energized and the workpiece 1 is permitted to travel along the workpath 44 as described hereinabove. The desired gap Y is maintained even as the upper 2 and lower 3 contact assemblies reciprocate in opposite directions.

While the invention has been particularly shown and described with reference to preferred embodiments thereof, it will be understood by those skilled in the art that various other changes in form and detail may be made therein without departing from the spirit and scope of the invention.

What is claimed is:

1. An apparatus for abrading a flat workpiece, the workpiece having a first surface and a second surface generally opposing the first surface, the apparatus comprising:
   means for transporting the workpiece across a work path;
   a first abrading assembly comprising:
      a lower contact assembly, the lower contact assembly having a first contacting platen, the first contacting platen having a first contact surface for abrading the first surface of the workpiece, said first contact surface being capable of fully contacting said first surface of the workpiece; and
      an upper contact assembly, the upper contact assembly positioned above the lower contact assembly in generally opposing parallel relation to the lower contact assembly, the upper contact assembly having a second contacting platen, the second contacting platen having a second contact surface spaced from the first contact surface of the lower contact assembly for abrading the second surface of the workpiece, said second contact surface being capable of fully contacting said second surface of the workpiece;
   means coupled to the lower and upper contact assemblies for reciprocating each of the lower contact assembly and upper contact assembly in opposing directions along a principal axis perpendicular to the work path and
   means for adjusting the space between the first contact surface of the lower contact assembly and the second contact surface of the upper contact assembly, said adjusting means comprising a plurality of micrometers mounted on one of the lower contact assembly and the upper contact assembly.

2. The apparatus as recited in claim 1 wherein the plurality of micrometers comprises three micrometers.

3. The apparatus as recited in claim 1 wherein the plurality of micrometers comprises at least three micrometers mounted on the lower contact assembly and at least three micrometers mounted on the upper contact assembly.

4. The apparatus as recited in claim 1 wherein one of the lower and upper contacting platens comprises granite.

5. The apparatus as recited in claim 1 wherein both of the lower and upper contacting platens comprise granite.

6. The apparatus as recited in claim 1 further comprising a second abrading assembly, the second abrading assembly substantially similar to the first abrading assembly, the second abrading assembly having a principal axis that is perpendicular to the work path.

7. The apparatus as recited in claim 1 wherein the principal axis of the second abrading assembly is substantially parallel to the principal axis of the first abrading assembly.

8. An apparatus for abrading a flat workpiece, the workpiece having a first surface and a second surface generally opposing the first surface, the apparatus comprising:
   means for transporting the workpiece across a work path;
   a first abrading assembly comprising:
      a lower contact assembly, the lower contact assembly having a first contacting platen, the first contacting platen having a first contact surface for abrading the first surface of the workpiece, said first contact surface being capable of fully contacting said first surface of the workpiece; and
      an upper contact assembly, the upper contact assembly positioned above the lower contact assembly in generally opposing parallel relation to the lower contact assembly, the upper contact assembly having a second contacting platen, the second contacting platen having a second contact surface spaced from the first contact surface of the lower contact assembly for abrading the second surface of the workpiece, said second contact surface being capable of fully contacting said second surface of the workpiece; and
   means coupled to the lower and upper contact assemblies for reciprocating each of the lower contact assembly and upper contact assembly in opposing directions along a principal axis perpendicular to the work path.

wherein said means for transporting the workpiece across the work path comprises:

a transport plate having a top surface parallel to and slightly below the second contacting surface of the second contacting platen, the transport plate having a first slot through which a first abrading assembly reciprocates, and first and second drive assemblies mounted across the workpath on either side of the abrading assembly for driving the workpiece into and out of the abrading assembly along the work path.

9. The apparatus as recited in claim 8 wherein the drive assemblies each comprise:

a roller rotatably mounted to the transport plate, the roller having a central rotation axis that runs parallel to the principal axis and is positioned above the transport plate.

10. An apparatus for abrading a flat workpiece, the workpiece having a first surface and a second surface generally opposing the first surface, the apparatus comprising:

means for transporting the workpiece across a work path;

a first abrading assembly comprising:

a lower contact assembly, the lower contact assembly having a first contacting platen, the first contacting platen having a first contact surface for abrading the first surface of the workpiece, said first contact surface being capable of fully contacting said first surface of the workpiece; and an upper contact assembly, the upper contact assembly positioned above the lower contact assembly in generally opposing parallel relation to the lower contact assembly, the upper contact assembly having a second contacting platen, the second contacting platen having a second contact surface spaced from the first contact surface of the lower contact assembly for abrading the second surface of the workpiece, said second contact surface being capable of fully contacting said second surface of the workpiece; and means coupled to the lower and upper contact assemblies for reciprocating each of the lower contact assembly and upper contact assembly in opposing directions along a principal axis perpendicular to the work path;

wherein said reciprocating means comprises:

first sliding means coupled to the lower contact assembly;

second sliding means coupled to the upper contact assembly; and cam means coupled to the lower contact assembly and the upper contact assembly housing for translating rotational motion to linear motion.

11. The apparatus as recited in claim 10 wherein one of the first and second sliding means comprises a shaft fixed to one of the respective lower contact assembly and upper contact assembly and a bearing assembly adapted for receiving the shaft.

12. The apparatus as recited in claim 10 wherein the cam means comprises:

a vertical cam shaft;

lower and upper cams mounted along the cam shaft, the lower and upper cams having complementary lobes; and lower and upper cam followers fixed respectively to lower and upper contact assemblies and maintained in positive intimate contact with the respective lower and upper cams.

* * * * *